United States Patent [19]
Yamaguchi et al.

[11] Patent Number: 5,589,735
[45] Date of Patent: Dec. 31, 1996

[54] EMISSION DEVICE WITH A CADMIUM LAMP

[75] Inventors: Akiyasu Yamaguchi; Yukio Yasuda; Tsuneo Okanuma; Tatsushi Igarashi; Hiromitsu Matsuno, all of Hyogo-ken; Tatsumi Hiramoto, Tokyo, all of Japan

[73] Assignee: Ushiodenki Kabushiki Kaisha, Japan

[21] Appl. No.: 506,829

[22] Filed: Jul. 25, 1995

[30] Foreign Application Priority Data

Jul. 29, 1994 [JP] Japan ................... 6-196206

[51] Int. Cl.⁶ .................. H01J 7/08; H01J 61/18
[52] U.S. Cl. .................. 313/638; 313/620; 313/621; 313/573; 313/642
[58] Field of Search .................. 313/638, 643, 313/642, 639, 620, 621, 571, 572, 573; 315/50, 326, DIG. 1, DIG. 5

[56] References Cited

U.S. PATENT DOCUMENTS

| | | | |
|---|---|---|---|
| 2,659,833 | 11/1953 | Anderson, Jr. | 313/638 |
| 3,758,805 | 9/1973 | Geller et al. | 313/638 |
| 5,394,059 | 2/1995 | Ohyama et al. | 313/638 X |
| 5,471,278 | 11/1995 | Yasuda et al. | 313/638 X |
| 5,489,819 | 2/1996 | Sakai et al. | 313/638 X |

FOREIGN PATENT DOCUMENTS 0163760 12/1980 Japan ................... 313/638

Primary Examiner—Sandra L. O'Shea
Assistant Examiner—Ashok Patel
Attorney, Agent, or Firm—Sixbey, Friedman, Leedom & Ferguson, P.C.; David S. Safran

[57] ABSTRACT

An emission device which operates a cadmium lamp with a light intensity sufficient for used in industrial applications is achieved by an emission device having a cadmium lamp with a fluorescent tube within which a cathode and an anode are space a small distance apart and a buffer gas for easier initiation of luminous operation and metallic cadmium in an amount per unit volume of the fluorescent tube of $1 \times 10^{-4}$ g/cm³ to $3 \times 10^{-3}$ g/cm³ are encapsulated, and a power source device for supplying an electrical input between the cathode and the anode in an electrical input range from 0.5 kW to 5.0 kW with the condition:

$$6.03 + 2.79 \, W \leq r \leq 40$$

being satisfied, where the electrical input of the power source device into the cadmium lamp in steady-state luminous operation is W (kW) and the maximum inside radius of the fluorescent tube is r (mm).

2 Claims, 3 Drawing Sheets

EMISSION DEVICE WITH A CADMIUM LAMP

BACKGROUND OF THE INVENTION

1. Field of the Invention

The invention relates to an emission device of a cadmium lamp.

2. Description of the Related Art

In the photochemical industry and in the manufacture of semiconductor devices, lamps are used which emit ultraviolet radiation. For these lamps, mercury lamps or lamps in which a metal such as iron or the like is encapsulated in mercury lamps are used. In this regard, mainly the emission spectra of mercury are used.

Furthermore, as a lamp which emits light with even shorter wavelengths than these lamps, a cadmium lamp is known from which fight of wavelengths around 220 nm is emitted by the cadmium.

Experimental emission of a cadmium lamp of this type is easily done. To obtain sufficient light intensity which can be used for industrial applications, however, the cadmium pressure must be set relatively high during luminous operation. If, on the other hand, the cadmium pressure is too high, a self-absorption phenomenon of cadmium ions or the like occurs; this rather reduces the fight intensity.

SUMMARY OF THE INVENTION

Therefore, a primary object of the invention is to devise an emission device which operates a cadmium lamp which has a light intensity sufficient for use in industrial applications.

The object is achieved, according to preferred embodiments of the invention, by an emission device of a cadmium lamp in which a cathode and an anode are arranged within a fluorescent tube at a small distance relative to one another along with a buffer gas for easier initiation of luminous operation, and metallic cadmium with $1 \times 10^{-4}$ g/cm³ to $3 \times 10^{-3}$ g/cm³ as the emission material. A power source device is provided for supplying the electrical input between the cathode and anode of this cadmium lamp in an electrical input range from 0.5 kW to 5.0 kW and satisfying the condition $6.03 + 2.79 W \leq r \leq 40$, where the electrical input of the power source device into the cadmium lamp in steady-state luminous operation is designated W (kW) and the maximum internal radius of the fluorescent tube of the cadmium lamp is designated r (mm).

The object is, furthermore, achieved according to the invention by the distance d (mm) between the electrodes satisfying the condition $2 \leq d \leq 12$.

The inventors have ascertained that it is effective to establish an encapsulation amount of the metallic cadmium, a size of the above described lamp, and at the same time in conjunction with the size of the lamp, an input power, in order to emit light with short wavelengths which are sufficient for use in industrial applications.

In cadmium emissions, line spectra with wavelengths mainly in the range from 210 nm to 240 nm are emitted, the emission spectra being determined by the density distribution of cadmium atoms in a base state and of cadmium atoms and cadmium ions in an excitation state.

An emission which is formed when the excited cadmium atoms or cadmium ions return to the base state occurs for the most part from an arc column. In this region, there are a host of cadmium atoms or cadmium ions in the excitation state, while cadmium atoms in the base state are present in a relatively small amount. On the other hand, in a part remote from the arc column with a low temperature, there are hardly any cadmium atoms or cadmium ions in the excitation state, while cadmium atoms in the base state are present in a relatively large amount. The light formed on the arc column is absorbed, during passage through the low temperature part remote from the arc column, by the cadmium atoms in the base state.

This means that establishing the sizes of the fluorescent tubes in conjunction with the arc column can become a factor for determining the density distribution of the cadmium atoms in the base state and of the cadmium atoms and cadmium ions in the excitation state.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1A:
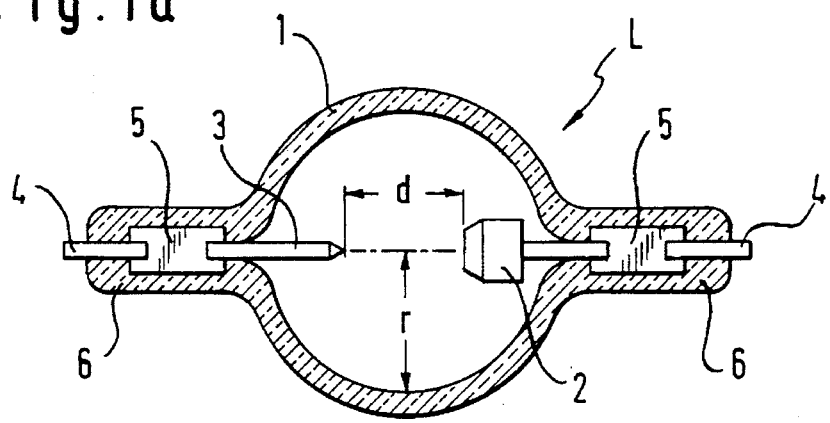
FIGS. 1(a) to 1(c) show a schematic cross section of cadmium lamps according to the invention.

FIG. 1 schematically shows a cadmium lamp L according to the invention in which reference number 1 indicates a fluorescent tube which is made of quartz glass and which has a roughly spherical central part with hermetically sealed parts 6 on opposite sides thereof. Within fluorescent tube 1, an anode 2 and a cathode 3 are spaced apart a small distance d relative to one another; for example, they are arranged 5 mm from one another. Anode 2 and cathode 3 are each connected to a metal foil 5 which is inserted in a respective hermetically sealed part 6, and furthermore, is connected to a respective outer lead 4. A power source device, described below, is connected to the outer leads 4, for supplying the desired power to the lamp.

As the emission substance, metallic cadmium, for example, with $1 \times 10^{-3}$ g/cm, and a buffer gas for easier initiation of luminous operation, for example, argon, are encapsulated in the fluorescent tube at a pressure of 100 torr. Mercury, which is usually encapsulated as an ultraviolet radiation emitting substance, essentially, is not encapsulated as an emission material. To prolong the luminous service life of the lamp, thallium iodide (TLI), mercury iodide ($HGI_2$ or cadmium iodide ($CdI_2$) is added as needed.

Figure 1B:
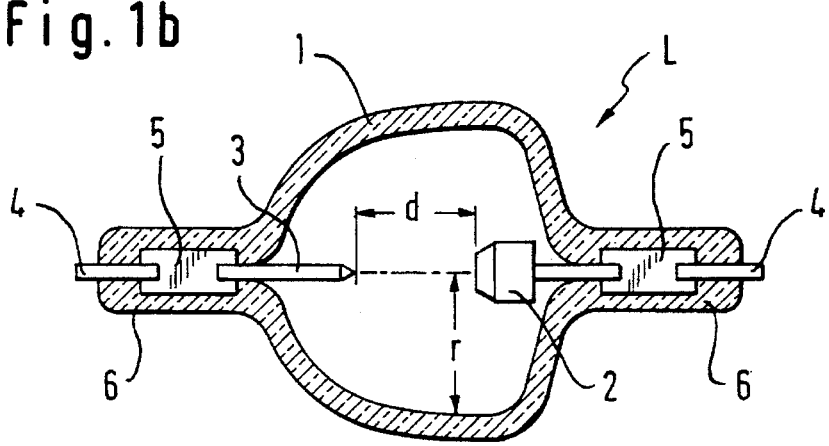
Figure 1C:
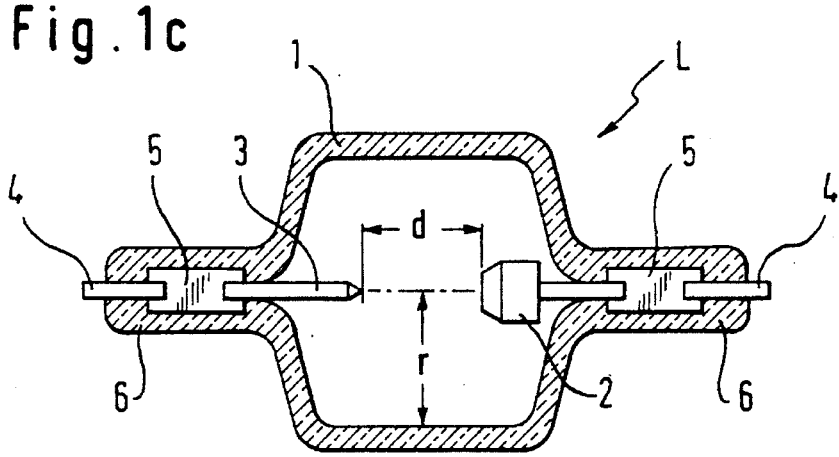

Here, the maximum value of the distance which is perpendicular to the lamp axis, i.e., to a virtual line between anode 2 and cathode 3, and runs to the inner surface of fluorescent tube 1, is called the maximum inside radius r. This maximum inside radius r designates a distance between the center of the fluorescent tube 1 and the inside of fluorescent tube 1 when fluorescent tube 1 is roughly spherical, as is shown in FIG. 1(a). The position of the maximum inside radius however differs in the case in which the fluorescent tube 1 has the pear shape that is shown in FIG. 1(b), or in the case in which fluorescent tube 1 has the cylindrical shape illustrated in FIG. 1(c). In FIG. 1(a) the maximum inside radius r is 23 mm.

Figure 2:
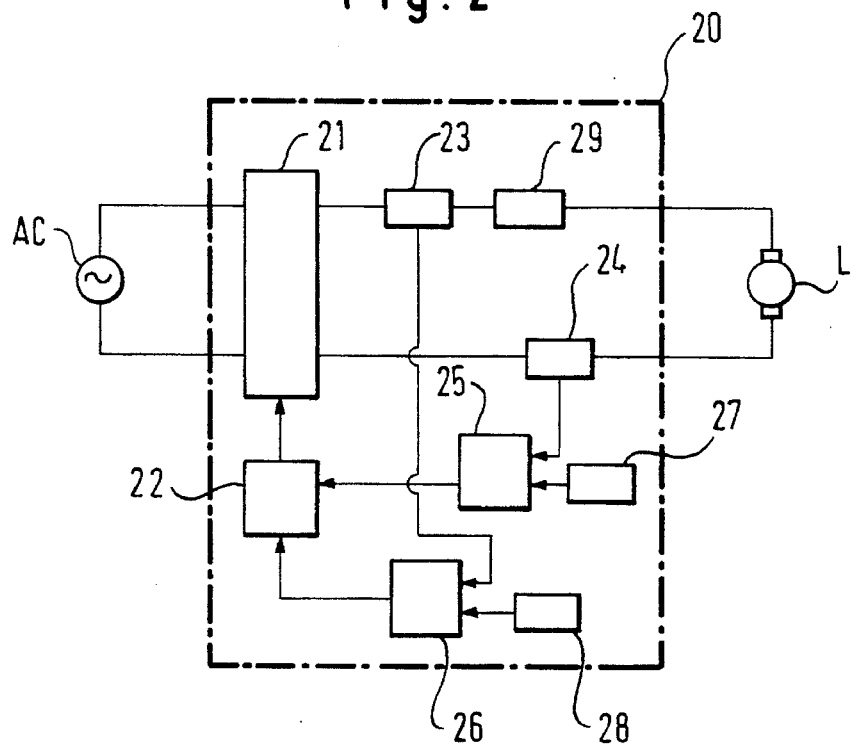
FIG. 2 shows a block diagram of a cadmium emission device according to the invention.

FIG. 2 illustrates a cadmium emission device according to the invention having a cadmium lamp L and a power source device 20. Power source device 20, for example, has a box-like shape of 200 mm (width)×250 mm (height)×360 mm (depth), and the power circuit shown in FIG. 2.

In particular, an AC supply current is supplied from alternating current source AC, and the desired power is supplied to lamp L via circuit 21. In circuit 21, by a conventional switching operation of semiconductor components, the operating power supplied to the lamp is adjusted, this switching process being controlled by means of a control circuit 22. The luminous voltage and the luminous current are determined by a luminous voltage determination device 23 and by a luminous current determination device 24 of lamp L, respectively, which output determination signals that are input into a comparator 25 and a comparator 26, respectively. At comparator 25, the luminous voltage signal of lamp L is compared to a reference value which is set in a reference voltage setting means 27, a computation is performed, and the result is input into control circuit 22, while at the comparator 26, the luminous current signal of lamp L is compared to a reference value which is set in a reference current setting means 28, a computation is performed, and the result is input, in the same way, into the control circuit 22. In this way, a control with feedback can be effected in order that the luminous power of the lamp L agrees with the reference power.

The above described control is a constant power control in which the luminous power of lamp L is constant. However, in the case in which the luminous voltage has only a small fluctuation and is stable, or in similar cases, determination of the luminous voltage can be omitted and constant current control can be effected by only determining the luminous current.

As is described above, electrical energy which is supplied to lamp L from power source device 20, using reference voltage setting means 27 and reference current setting means 28 of power source device 20, is supplied specifically by changes of the control resistances which form these setting means. A starter 29 is provided for generating a high voltage between the electrodes when luminous operation of lamp L is initiated.

Next, tests were run to determine the relationship between the size of the fluorescent tube and emission in the wavelength range from 210 nm to 240 nm. In the tests, several lamps were produced, for which in the lamp shown in FIG. 1(a) with a roughly spherical fluorescent tube, only the maximum inside radius r was changed in the range from 5 to 50 mm. Metallic cadmium was encapsulated into these lamps such that the mass per unit of volume within the fluorescent tube was the same and the emittance of light of wavelengths from 210 nm to 240 nm was measured for each lamp.

If the input voltage for the lamp is designated V (volt), the input current J (ampere), and the spectral radiation intensity which is measured at a distance l of wavelength λ (nm) emitted from lamp L is designated I (W/m².nm), the total amount with reference to the spectral radiation intensity I (W/m².nm)×4 πl is defined as the total radiation energy of the waves emitted from the lamp over the entire solid angle in the wavelength range from 210 nm to 240 nm per unit of time. A percentage representation of a quantity in which the above defined value is divided by W×J (W being the input power for lamp L) and multiplied by 100 is represented as the luminous efficiency η.

Figure 3:
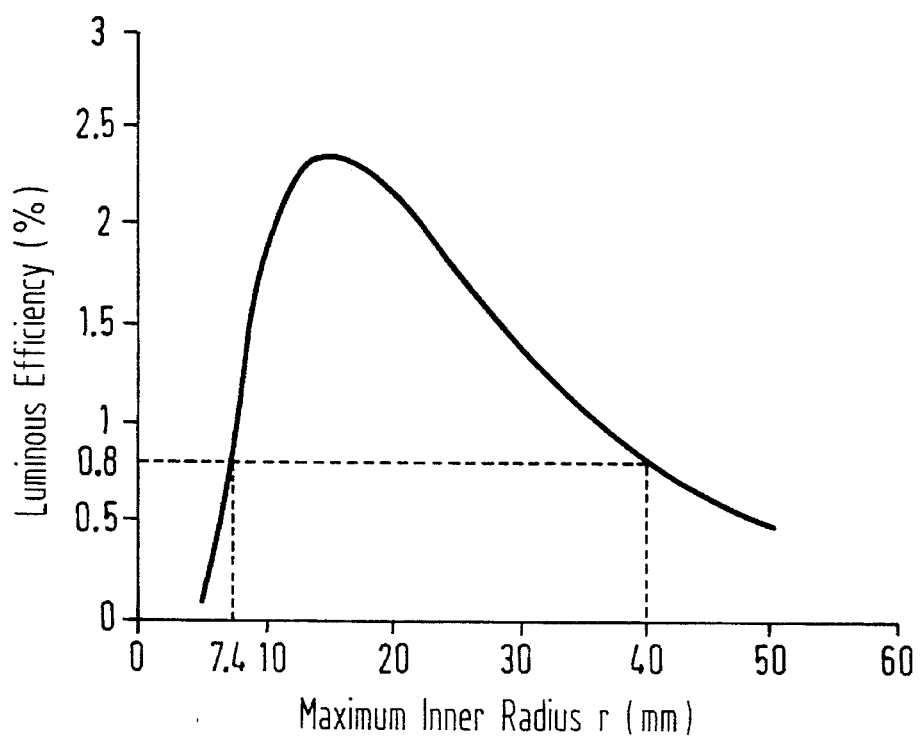
FIG. 3 is a graphic depiction of the relationship between luminous efficiency and maximum inner radius.

FIG. 3 shows the result. It is clear from the results that the luminous efficiency η changes with the maximum inside radius r of the fluorescent tube, even if the metallic cadmium present in the fluorescent tube has the same mass per unit of volume. Specifically, the luminous efficiency η is reduced to the highest degree and has a numerical value of less than 0.8% if the maximum inside radius r is less than 7.4 mm. The luminous efficiency η is likewise reduced to less than 0.8% if, on the other hand, the maximum inside radius r of the fluorescent tube is greater than 40 mm. This shows that by establishing the maximum inside radius of the fluorescent tube at greater than or equal to 7.4 mm and less than or equal to 40.0 mm, light in the wavelength range from 210 nm to 240 nm can be effectively emitted.

The same tests were run using the reference voltage setting means and the reference current setting means of the power source device to change the input power to the lamp. As a result thereof, in the input power range for the lamp from 0.5 kW to 5 kW, it was possible to maintain the same relationship as described above. That means that, within this input power range, the luminous efficiency η can be determined independently of the value of the input power and only by the value of the maximum radius r. Furthermore, it was found that, outside this input power range, the luminous efficiency η is not determined solely by the maximum inside radius r of the fluorescent tube. This illustrates that the relationship shown in FIG. 3 can be used for the lamp only within the input power range from 0.5 kW to 5 kW.

Furthermore, in luminous operation of the above described lamp with a duration of 1500 hours, luminous efficiency η was studied to determine whether sufficient light intensity can be maintained or not, even in the case in which the lamp is operated over a long period of time (i.e., 1500 hours). Here, the numerical value of 1500 hours represents a sufficient operational life for use in industrial applications.

Figure 4:
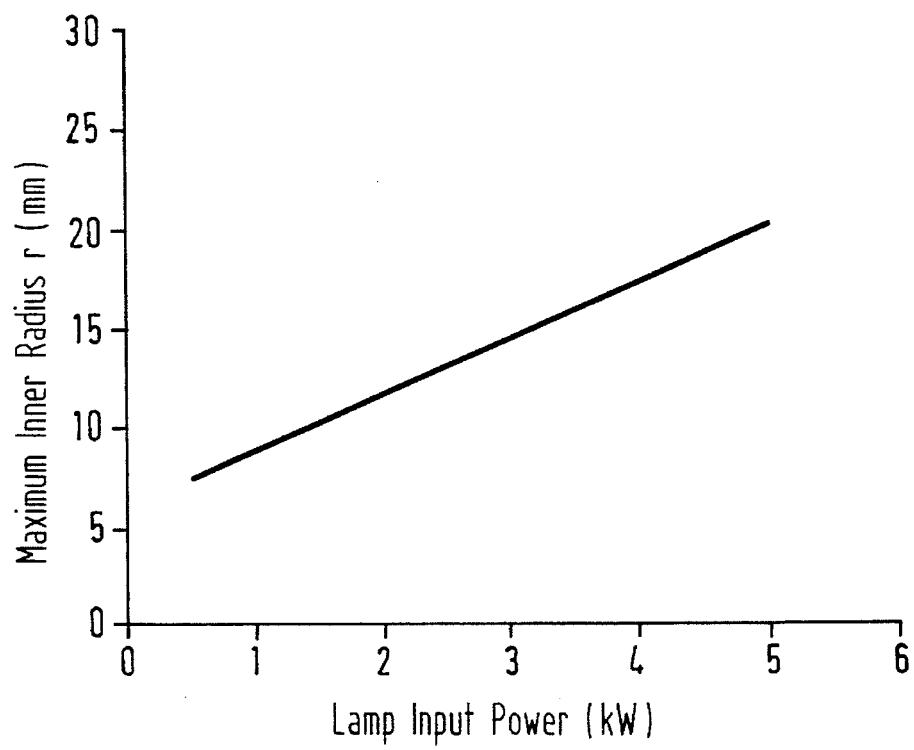
FIG. 4 is a graphic depiction of the relationship between the maximum inner radius and input power.

FIG. 4 shows the results of the luminous operation tests. Here, the cadmium lamp was supplied with different input powers, the radiated light was measured in the wavelength range from 210 nm to 240 nm and the maximum inside radius r of the fluorescent tube was recorded at which the light intensity after 1500 hours of illumination maintained 80% of the light intensity which existed at the start of luminous operation.

At an input power of 0.5 kW, sufficient light intensity can be maintained even after 1500 hours of luminous operation of the lamp when the maximum inside radius r is roughly 7.5 mm. At an input power of roughly 1 kW, sufficient light intensity can be maintained even after 1500 hours of luminous operation of the lamp if the maximum inside radius r is approximately 10 mm. Even at input powers of 2 kW, 3 kW, 4 kW and 5 kW, likewise, sufficient light intensity can be maintained even after 1500 hours of luminous operation if the maximum radius r has the value shown in the FIG. 4.

It was found from these tests that the maximum inside radius r of the fluorescent tube and the input power must satisfy the following condition in order to adequately maintain the light intensity even during luminous operation over a long time:

$$r(mm) = 6.03 + 2.79 \times W(kW)$$

If the maximum radius r is greater than the value of r which is determined by the above formula, the light intensity can of course be adequately maintained while the emission decreases if it is greater than 40 mm, as described above. Furthermore, it was determined that this relationship can be used in the input power range from 0.5 kW to 5 kW, and that outside this range there is no clear relationship.

Figure 5:
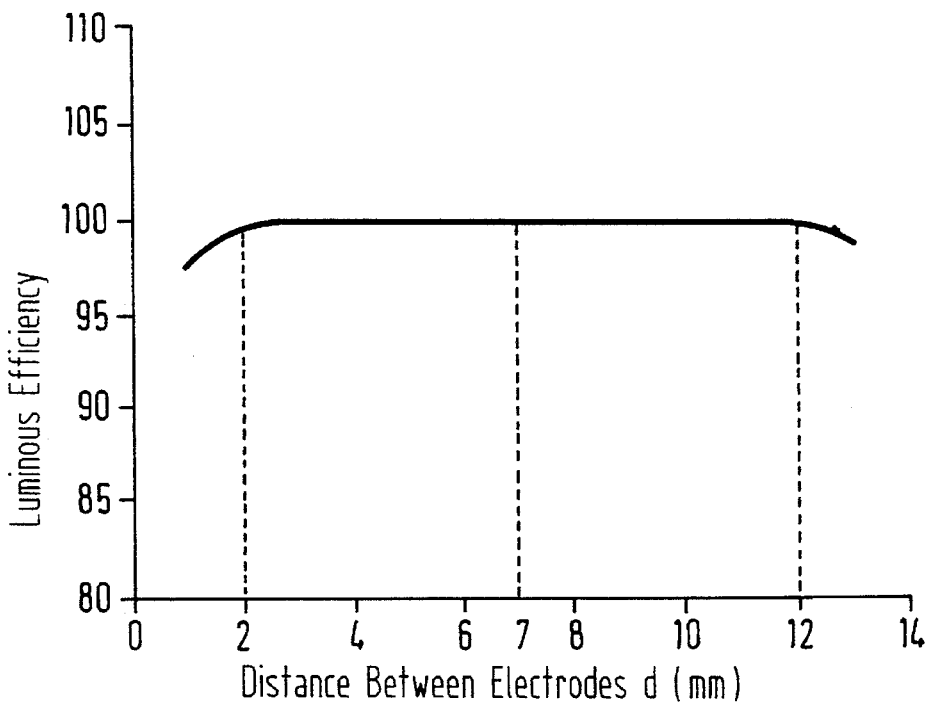
FIG. 5 is a graphic depiction of the relationship between luminous efficiency and the distance between the electrodes.

In addition, using a lamp with the same arrangement as the lamp shown in FIG. 1(a) with a roughly spherical emission part, the relationship between the distance d between the electrodes and the luminous efficiency η was studied. In the tests, several lamps were produced in which the distance d between the electrodes was changed in a range from 1.0 mm to 13.0 mm, in 1.0 mm increments. Other conditions, such as the amount of metallic cadmium encapsulated within the fluorescent tube per unit of volume and the like, were made the same as in the above described tests, and all of the lamps tested were operated with an input power of 2 kW. FIG. 5 shows the results of these tests.

Here, with reference to each of the above described cadmium lamps, with an input power of 2 kW, the radiated light was measured in the wavelength range from 210 nm to 240 nm and the distance d between the electrodes and the luminous efficiency η thereof were determined. In the representation, the luminous efficiency η at the respective distance d between the electrodes is illustrated by means of a relative value where the luminous efficiency η at a distance between the electrodes of 7 mm is assigned a value of 100.

As the drawing shows, the luminous efficiency η is not heavily dependent on the distance d between the electrodes. It is, however, apparent that it decreases in a small amount in the case in which the distance between the electrodes is less than 2 mm or greater than 12 mm. It can. therefore, be ascertained that it is desirable that a distance between the electrodes be selected in construction of the lamp which satisfies the condition $2 \leq d \leq 12$.

Furthermore, in a check of the transmission factor of the ultraviolet radiation, it was found that stable light emergence with sufficient intensity from the lamp can be obtained if quartz glass is used with a minimum transmission factor in a horizontal direction in the wavelength range from 210 nm to 240 nm which is greater than or equal to 12%.

Moreover, a check was also run with respect to the encapsulated amount of cadmium. In the case in which the encapsulated amount of the cadmium is less than or equal to $1 \times 10^{-4}$ g/cm$^3$, due to the lack of emission material and in spite of the size of the fluorescent tube sufficient emission intensity could not be obtained. If, conversely, the encapsulated amount of cadmium is greater than $3 \times 10^{-3}$ g/cm$^3$, as the result of an absorption effect of the cadmium ions and cadmium atoms, likewise, sufficient emission intensity cannot be maintained in spite of the size of the fluorescent tube.

Action of the Invention

According to the invention, by optimum selection of the size of the fluorescent tube, light with wavelengths of 210 nm to 240 nm can be emitted which is sufficient for use in industrial applications. Furthermore, while the above test were conducted with respect to the FIG. 1(a) lamp, it is to be understood that the relationships determined apply also to the lamps shown in FIGS. 1(b) and 1(c).

It is to be understood that, although preferred embodiments of the invention have been described, various other embodiments and variations may occur to those skilled in the art. Any such other embodiments and variations which fall within the scope and spirit of the present invention are intended to be covered by the following claims.

We claim:

1. An emission device comprising a cadmium lamp having a fluorescent tube within which a cathode and an anode are spaced apart with respect to one another and a buffer gas for easier initiation of luminous operation and metallic cadmium in an amount per unit volume of the fluorescent tube of $1 \times 10^{-4}$ g/cm$^3$ to $3 \times 10^{-3}$ g/cm$^3$ are encapsulated, and a power source device for supplying electrical input between the cathode and the anode in an electrical input range from 0.5 kW to 5.0 kW and in accordance with the relationship:

$$6.03 + 2.79\ W \leq r \leq 40$$

where the electrical input of the power source device into the cadmium lamp in steady-state luminous operation is designated W (kW) and a maximum inside radius of the fluorescent tube of the cadmium lamp is designated r (mm).

2. An emission device according to claim 1, wherein a distance d (mm) between the cathode and the anode satisfies condition $2 \leq d \leq 12$.

* * * * *